US006978437B1

(12) United States Patent
Rittman et al.

(10) Patent No.: US 6,978,437 B1
(45) Date of Patent: *Dec. 20, 2005

(54) PHOTOMASK FOR ELIMINATING ANTENNA EFFECTS IN AN INTEGRATED CIRCUIT AND INTEGRATED CIRCUIT MANUFACTURE WITH SAME

(75) Inventors: Danny Rittman, Sunnyvale, CA (US); Micha Oren, Cupertino, CA (US)

(73) Assignee: Toppan Photomasks, Inc., Round Rock, TX (US)

( * ) Notice: Subject to any disclaimer, the term of this patent is extended or adjusted under 35 U.S.C. 154(b) by 281 days.

This patent is subject to a terminal disclaimer.

(21) Appl. No.: 10/393,687

(22) Filed: Mar. 20, 2003

Related U.S. Application Data (63) Continuation-in-part of application No. 09/684,793, filed on Oct. 10, 2000, now abandoned.

(51) Int. Cl.[7] .......................... G06F 17/50; G06F 19/00; G21K 5/00; G03F 1/14
(52) U.S. Cl. .................... 716/21; 716/10; 700/120; 700/121; 378/35; 430/5; 250/492.3
(58) Field of Search .................... 716/21, 10; 700/120, 700/121; 378/35; 430/5; 250/492.3; 382/144

(56) References Cited

U.S. PATENT DOCUMENTS

| | | | | |
|---|---|---|---|---|
| 4,637,713 A | * | 1/1987 | Shulenberger et al. | 355/76 |
| 5,461,572 A | | 10/1995 | Ichikawa | 716/5 |
| 5,616,927 A | * | 4/1997 | Kubota et al. | 250/492.2 |
| 5,650,651 A | | 7/1997 | Bui | 257/355 |
| 5,793,836 A | * | 8/1998 | Maldonado et al. | 378/35 |
| 5,984,510 A | * | 11/1999 | Guruswamy et al. | 716/2 |
| 5,987,086 A | * | 11/1999 | Raman et al. | 716/1 |
| 6,006,024 A | * | 12/1999 | Guruswamy et al. | 716/12 |
| 6,113,648 A | | 9/2000 | Schuelein et al. | 716/17 |
| 6,144,037 A | * | 11/2000 | Ryan et al. | 250/492.2 |
| 6,192,100 B1 | * | 2/2001 | Acosta et al. | 378/35 |
| 6,209,123 B1 | * | 3/2001 | Maziasz et al. | 716/14 |
| 6,254,942 B1 | * | 7/2001 | Tanaka | 428/14 |
| 6,284,417 B1 | * | 9/2001 | Williams | 430/5 |

(Continued)

FOREIGN PATENT DOCUMENTS

EP  0838857 A2  4/1998  ........... H01L 27/02

(Continued)

OTHER PUBLICATIONS

Chang et al., "Degradation of MOS transistor characteristics by gate charging damage during plasma processing", 1993 International Symposium on VLSI Technology, Systems, and Applications, May 12, 1993, pp. 320-324.*

(Continued)

Primary Examiner—Matthew Smith
Assistant Examiner—Phallaka Kik
(74) Attorney, Agent, or Firm—Baker Botts L.L.P.

(57) ABSTRACT

A photomask for eliminating antenna effects in an integrated circuit and integrated circuit manufactured with the photomask are disclosed. The photomask includes a substrate and a patterned layer formed on at least a portion of the substrate. The patterned layer may be formed using a mask pattern file created by analyzing a pattern in a mask layout file to identify a region including an antenna ratio less than a first design rule. A feature located in the identified region is moved based on a second design rule from a first position to a second position in the mask layout file to create a space in the identified region. A grounding feature is placed in the space and automatically connected to a gate feature in the mask layout file such that the antenna ratio is increased to greater than or approximately equal to the first design rule.

22 Claims, 5 Drawing Sheets

U.S. PATENT DOCUMENTS

| | | | |
|---|---|---|---|
| 6,324,439 B1 * | 11/2001 | Cheung et al. ............. | 700/121 |
| 6,360,134 B1 * | 3/2002 | Van Den Broeke ......... | 700/121 |
| 6,376,131 B1 * | 4/2002 | Cho et al. ..................... | 430/5 |
| 6,421,816 B1 * | 7/2002 | Ishikura ......................... | 716/7 |
| 6,421,820 B1 * | 7/2002 | Mansfield et al. ............ | 716/21 |
| 6,475,575 B1 * | 11/2002 | Ikuta et al. ................... | 428/14 |
| 6,492,067 B1 * | 12/2002 | Klebanoff et al. ............ | 430/5 |
| 6,496,959 B1 | 12/2002 | Noguchi ........................ | 716/4 |
| 6,502,225 B2 * | 12/2002 | Ishikura ......................... | 716/7 |
| 6,502,226 B2 * | 12/2002 | Ishikura ......................... | 716/7 |
| 6,502,229 B2 * | 12/2002 | Lee et al. ...................... | 716/12 |
| 6,594,809 B2 * | 7/2003 | Wang et al. ................... | 716/10 |
| 6,611,950 B2 * | 8/2003 | Ishikura ......................... | 716/7 |
| 6,847,434 B2 * | 1/2005 | Laganza et al. .............. | 355/75 |
| 6,862,723 B1 * | 3/2005 | Wang et al. ................... | 716/13 |
| 2001/0014375 A1 * | 8/2001 | Tanaka ......................... | 428/14 |
| 2001/0018757 A1 * | 8/2001 | Morikawa ..................... | 716/5 |
| 2002/0066067 A1 * | 5/2002 | Wang et al. ................... | 716/11 |
| 2002/0083404 A1 * | 6/2002 | Ishikura ......................... | 716/7 |
| 2002/0083405 A1 * | 6/2002 | Ishikura ......................... | 716/7 |
| 2002/0138817 A1 * | 9/2002 | Lee et al. ...................... | 716/12 |
| 2004/0088658 A1 * | 5/2004 | Minda ........................... | 716/1 |
| 2004/0128636 A1 * | 7/2004 | Ishikura ......................... | 716/7 |

FOREIGN PATENT DOCUMENTS

| | | | | |
|---|---|---|---|---|
| JP | 62183158 A | | 8/1987 | ........... H01L 27/06 |
| JP | 09082811 A | | 3/1997 | ....... H01L 21/8238 |
| JP | 11214521 A | * | 8/1999 | ........... H01L 21/82 |
| TW | 430864 A | * | 4/2001 | ........... H01L 21/00 |
| WO | WO 9615554 A1 | * | 5/1996 | ......... H01L 23/485 |

OTHER PUBLICATIONS

Gill et al., "Plasma induced damage on sub-0.5 um MOSFETs using a CMOS driver as input protection", 1998 3rd International Symposium on Plasma Process-Induced Damage, Jun. 4, 1998, pp. 100-103.*

Friedmann et al., "Plasma-induced charging damage to MOS capacitor structures in electron-cyclotron-resonance plasmas", 1995 IEEE Internaltional Conference on Plasma Science, Jun. 5, 1995, p. 164.*

U.S. Appl. No. 10/393,690 entitled *System and Method for Generating a Mask Layout File to Eliminate Antenna Effects in an Integrated Circuit* filed by Rittman et al. on Mar. 20, 2003; 52 pages.

* cited by examiner

PHOTOMASK FOR ELIMINATING ANTENNA EFFECTS IN AN INTEGRATED CIRCUIT AND INTEGRATED CIRCUIT MANUFACTURE WITH SAME

RELATED APPLICATIONS

This application is a continuation-in-part of U.S. patent application Ser. No. 09/684,793, filed Oct. 10, 2000 and entitled "AUTOMATIC DIFFUSION DIODE ('ANTENNA') CONSTRUCTION, PLACEMENT AND CONNECTION IN IC MASK LAYOUT DATABASE METHOD AND COMPUTER SOFTWARE", now abandoned.

TECHNICAL FIELD OF THE INVENTION

This invention relates in general to the field of photolithography, and more particularly to a photomask for eliminating antenna effects in an integrated circuit and integrated circuit manufactured with the photomask.

BACKGROUND OF THE INVENTION

A typical semiconductor design process includes numerous steps. Initially, a circuit designer prepares a schematic diagram that includes logical connections between logic elements that form an integrated circuit. The schematic diagram is then tested to verify that the logic elements and associated logical connections perform a desired function. Once the circuit is verified, the schematic diagram is converted into a mask layout database that includes a pattern of polygons. The polygons may represent the logic elements and the logical connections contained the schematic diagram. The mask layout database is then converted into multiple photomasks, also know as masks or reticles, that may be used to image different layers of the integrated circuit on to a semiconductor wafer.

Over the past several years, the number of transistors that form an integrated circuit has increased dramatically. As the number of transistors increase, the widths of the gates that form these transistors continue to decrease. During a fabrication process for an integrated circuit, various plasma etching and ion implantation techniques may be used, which may cause a charge to build up in a polysilicon gate. If the metal area to polysilicon gate ratio is low, the voltage buildup in the polysilicon gate may be tolerable. However, if the metal area is large compared to the polysilicon to which it is connected, there may be sufficient charge build up to degrade and even damage the polysilicon gate. This higher ratio of metal area to polysilicon gate is known as the antenna effect because the additional metal area acts like an antenna that collects charge.

The antenna effect may be reduced or eliminated by reducing the ratio of the metal area to the polysilicon gate area. Typically, a mask layout database may be analyzed either manually or automatically to determine regions where the antenna effect requires that the amount of metal be reduced. The areas affected by the antenna effect are then manually edited by a layout designer. The process of editing the layout database may be time consuming since the designer must create space for additional polygons, place the polygons in the mask layout database, and provide the appropriate electrical connections between the logic functions. During the placement and routing process, the layout designer may move polygons in order to provide a connection to the appropriate node. The layout designer may inadvertently create design rule violations or connectivity errors. The layout designer may then have to correct the violations and errors until the mask layout database is clean. The process of iteratively correcting the design rule violations may take several hours or even days to complete and can increase the time needed to design the integrated circuit. The additional time required to complete layout may also delay the production of a photomask set used to fabricate the integrated circuit.

SUMMARY OF THE INVENTION

In accordance with the present invention, the disadvantages and problems associated eliminating antenna effects in an integrated circuit have been substantially reduced or eliminated. In a particular embodiment, a photomask is formed by using a mask pattern file created by moving a feature located in an identified region from a first position to a second position without violating a design rule to create a space and connecting a grounding feature to a gate feature in the mask layout file to increase an antenna ratio.

In accordance with one embodiment of the present invention, a photomask for eliminating antenna effects in an integrated circuit includes a patterned layer formed on at least a portion of a substrate. The patterned layer may be formed using a mask pattern file that is created by analyzing a pattern in a mask layout file to identify a region including an antenna ratio less than a first design rule. A feature located in the identified region is moved based on a second design rule from a first position to a second position in the mask layout file to create a space in the identified region. A grounding feature is placed in the space and connected to a gate feature in the mask layout file such that the antenna ratio is increased to greater than or approximately equal to the first design rule.

In accordance with another embodiment of the present invention, an integrated circuit includes a plurality of interconnect layers, including but not limited to n-well, p-well, diffusion, polysilicon and metal, and a plurality of contact layers that provide electrical connections between the respective interconnect layers. The interconnect and contact layers may be formed using a plurality of photomasks that are created by analyzing a pattern in a mask layout file to identify a region including an antenna ratio less than a first design rule. A feature located in the identified region is moved based on a second design rule from a first position to a second position in the mask layout file to create a space in the identified region. A grounding feature is placed in the space and connected to a gate feature in the mask layout file such that the antenna ratio is increased to greater than or approximately equal to the first design rule.

Important technical advantages of certain embodiments of the present invention include a placement tool that automatically creates a space in a mask layout file to add grounding features that eliminate antenna effects during fabrication of an integrated circuit. The placement tool analyzes a pattern in the mask layout file to identify regions where an antenna ratio is less than a design rule from a technology file. The placement tool automatically moves features in the identified regions in order to create a space for a grounding feature near a gate feature and reduce the antenna ratio. The placement tool automatically places the moved features in new positions in the mask layout file and connects the moved features to the appropriate nodes in the identified region to maintain connectivity.

Another important technical advantage of certain embodiments of the present invention includes a placement tool that reduces the amount of time required to design and manufacture a semiconductor device. During placement of the grounding features in a mask layout file, the placement tool invokes a design rule fix (DRF) tool and a layout versus schematic (LVS) tool to respectively correct design rule violations and connectivity errors. Since the placement and correction processes occur together, the mask layout file may be free of design rule violations in a shorter amount of time, which reduces the cycle time for manufacturing a photomask used to fabricate the semiconductor device.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments of the present invention and their advantages are best understood by reference to FIGS. 1 through 7, where like numbers are used to indicate like and corresponding parts.

As the number of transistors on an integrated circuit continues to increase, the design process for the integrated circuit becomes more complex. For example, an increasing number of transistors may require additional layers to form the integrated circuit on a semiconductor wafer. Each layer associated with the integrated circuit may include one or more design rules for the individual layer in a desired manufacturing process. The number of design rules for the desired manufacturing process, therefore, increases with the number of layers formed on the semiconductor wafer.

A design rule typically defines the minimum or maximum allowable dimension for a feature fabricated on a specific layer. For example, an integrated circuit may include, among other layers, a diffusion layer that forms a diffusion diode and/or the source or drain regions of a transistor, a polysilicon layer that forms the gate of the transistor, a metal layer that forms interconnects between transistors, and a contact or via layer that connects the polysilicon or diffusion layer to the metal layer or connects a lower metal layer to a higher metal layer. Each layer typically has one or more design rules associated with features in a mask layout file that are formed on the specific layer. The design rules for a metal layer may include, but are not limited to, a minimum allowable spacing between two adjacent metal features, a minimum width of a metal feature and a minimum and/or maximum length of a metal feature. The polysilicon and contact layers may include similar design rules where the minimum or maximum allowable dimensions are unique to that layer.

Figure 1:
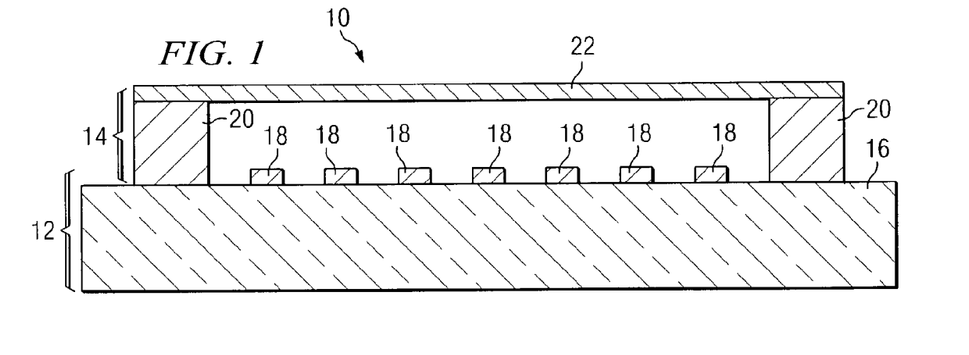
FIG. 1 illustrates a cross-sectional view of a photomask assembly manufactured in accordance with teachings of the present invention.

FIG. 1 illustrates a cross-sectional view of photomask assembly 10 manufactured using a mask layout file. Photomask assembly 10 includes photomask 12 coupled to pellicle assembly 14. Substrate 16 and patterned layer 18 form photomask 12, otherwise known as a mask or reticle, that may have a variety of sizes and shapes, including but not limited to round, rectangular, or square. Photomask 12 may also be any variety of photomask types, including, but not limited to, a one-time master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM), an optical proximity correction (OPC) mask or any other type of mask suitable for use in a lithography system.

Photomask 12 includes patterned layer 18 formed on substrate 16 that, when exposed to electromagnetic energy in a lithography system, projects a pattern onto a surface of a semiconductor wafer (not expressly shown). Substrate 16 may be a transparent material such as quartz, synthetic quartz, fused silica, magnesium fluoride ($MgF_2$), calcium fluoride ($CaF_2$), or any other suitable material that transmits at least seventy-five percent (75%) of incident light having a wavelength between approximately 10 nanometers (nm) and approximately 450 nm. In an alternative embodiment, substrate 16 may be a reflective material such as silicon or any other suitable material that reflects greater than approximately fifty percent (50%) of incident light having a wavelength between approximately 10 nm and 450 nm.

Patterned layer 18 may be a metal material such as chrome, chromium nitride, a metallic oxy-carbo-nitride (M-O-C-N), where the metal is selected from the group consisting of chromium, cobalt, iron, zinc, molybdenum, niobium, tantalum, titanium, tungsten, aluminum, magnesium and silicon, and any other suitable material that absorbs electromagnetic energy with wavelengths in the ultraviolet (UV) range, deep ultraviolet (DUV) range, vacuum ultraviolet (VUV) range and extreme ultraviolet range (EUV). In an alternative embodiment, patterned layer 18 may be a partially transmissive material, such as molybdenum silicide (MoSi), which has a transmissivity of approximately one percent (1%) to approximately thirty percent (30%) in the UV, DUV, VUV and EUV ranges.

Frame 20 and pellicle film 22 may form pellicle assembly 14. Frame 20 is typically formed of anodized aluminum, although it could alternatively be formed of stainless steel, plastic or other suitable materials. Pellicle film 22 may be a thin film membrane formed of a material such as nitrocellulose, cellulose acetate, an amorphous fluoropolymer, such as TEFLON® AF manufactured by E. I. du Pont de Nemours and Company or CYTOP® manufactured by Asahi Glass, or another suitable film that is transparent to wavelengths in the UV, DUV, EUV and VUV ranges. Pellicle film 22 may be prepared by a conventional technique such as spin casting.

Pellicle film 22 protects photomask 12 from contaminants, such as dust particles, by ensuring that the contaminants remain a defined distance away from photomask 12. This may be especially important in a lithography system. During a lithography process, photomask assembly 10 is exposed to electromagnetic energy produced by a radiant energy source within the photolithography system. The electromagnetic energy may include light of various wavelengths, such as wavelengths approximately between the I-line and G-line of a Mercury arc lamp, or DUV, VUV or EUV light. In operation, pellicle film 22 is designed to allow a large percentage of the electromagnetic energy to pass through it. Dust particles collected on pellicle film 22 will likely be out of focus at the surface of the wafer being processed and, therefore, the exposed image on the wafer should be clear. Pellicle film 22 formed in accordance with the teachings of the present invention may be satisfactorily used with all types of electromagnetic energy and is not limited to lightwaves as described in this application.

Photomask 12 may be formed from a photomask blank using standard lithography processes. In a lithography process, a mask pattern file that includes data for patterned layer 18 may be generated from a mask layout file. The mask layout file may include features that represent transistors and electrical connections for an integrated circuit. The features in the mask layout file may further represent different layers of the integrated circuit when it is fabricated on a semiconductor wafer.

For example, a transistor may be formed on a semiconductor wafer from a diffusion layer and a polysilicon layer. The mask layout file, therefore, may include one or more features drawn on the diffusion layer and one or more features drawn on the polysilicon layer. The features for each layer may be converted into a mask pattern file that represents one layer of the integrated circuit. Each mask pattern file may be used to generate a photomask for the specific layer.

A common problem in integrated circuits occurs during fabrication when certain processing steps create a static charge in floating conducting regions (e.g., regions that are not connected to any diffusion areas but only to gate areas). The charge build up can accumulate on the gate, which leads to high electric fields across the gate oxide. If the charge is sufficiently large, it may cause gate oxide breakdown that leads to yield and/or reliability problems. Typically a large amount of charge accumulation may occur in regions where an area of a polysilicon gate located over diffusion is small compared to an area of metal or polysilicon that is located over field oxide and connected to the polysilicon gate.

This effect, known as the antenna effect, may be eliminated by adding a grounding feature to a polysilicon gate such that the charge is diverted from the gate oxide region into the substrate of the integrated circuit. In one embodiment, a mask layout file may be analyzed to identify regions in the mask layout file where an antenna ratio is less than a design rule from a technology file for a specific manufacturing process. The antenna ratio may be defined as the amount of polysilicon (or amorphous silicon) located over a diffusion area, which forms the gate of a transistor, compared to the amount of metal and/or polysilicon located over field oxide that is connected to the gate of the transistor.

If a region is identified that includes a small area of polysilicon over diffusion and a large area of metal or polysilicon over field oxide, the region may further be analyzed to determine if the grounding feature may be added to the polysilicon gate. If space is available in the identified region, the grounding feature may be automatically placed in the identified region and connected to the polysilicon gate.

If the identified region does not include a suitable space, certain features located in the identified area may be moved in order to create a space for the grounding feature. The moved features from the identified region may be repositioned in the mask layout file either inside the identified region or outside the identified region at a position where an appropriate connection may be established to maintain connectivity between the moved features and the appropriate nodes in the identified region. In one embodiment, a compaction algorithm may be used in combination with a design rule fix (DRF) tool and a layout versus schematic (LVS) tool to reduce dimensions of the features in the mask pattern file, ensure that placing the moved features in the new position does not create new design rule violations and ensure that the connectivity within the mask layout file is maintained.

Once any features have been repositioned, a grounding feature may be placed in the space created in the identified region. The grounding feature may be automatically connected to the gate of the transistor. Again, the DRF and LVS tools may be used to respectively correct any design rule violations and connectivity violations created when the grounding feature is added and the electrical connections from the grounding feature to the transistor gate are generated. Since all additions and checks are performed automatically, the mask layout file may be generated in a reduced amount of time.

The mask layout file may then be converted into multiple mask pattern files that represent the various layers of the integrated circuit. The desired pattern from the mask pattern file may be imaged into a resist layer of the photomask blank using a laser, electron beam or X-ray lithography tool. In one embodiment, a laser lithography tool uses an Argon-Ion laser that emits light having a wavelength of approximately 364 nanometers (nm). In alternative embodiments, the laser lithography tool uses lasers emitting light at wavelengths from approximately 150 nm to approximately 300 nm. Photomask 12 may be fabricated by developing and etching exposed areas of the resist layer to create a pattern, etching the portions of patterned layer 18 not covered by resist, and removing the undeveloped resist to create patterned layer 18 over substrate 16.

Photomask 12 may then be placed into a lithography system to project an image onto the surface of a semiconductor wafer. A separate photomask is used for each individual layer of the integrated circuit. For example, one photomask may be used to create the diffusion regions on a wafer and another photomask may be used to create a layer of polysilicon over the diffusion regions. Each layer of the integrated circuit on the semiconductor wafer may be fabricated by imaging the pattern from photomask 12 into a resist layer, developing and etching exposed areas of the resist layer, etching the portions of the under lying material (e.g., diffusion, polysilicon, or metal) and removing the undeveloped resist. Each layer of the integrated circuit formed on the semiconductor wafer may be separated by a layer of insulating material, such as silicon dioxide.

Figure 2:
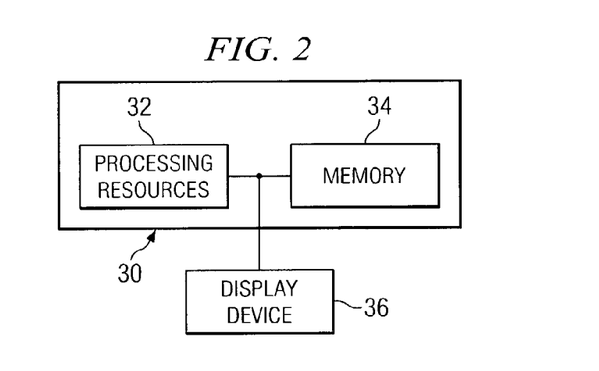
FIG. 2 illustrates a block diagram of a computer system for generating a mask layout file to eliminate antenna effects in an integrated circuit in accordance with teachings of the present invention.

FIG. 2 illustrates a block diagram of computer system 30 for generating a mask layout file by automatically placing a grounding feature in the mask layout file to eliminate antenna effects in an integrated circuit. In the illustrated embodiment, computer system 30 includes processing resource 32, memory 34 and display device 36. Processing resource 32 may be a microprocessor, a microcontroller, a digital signal processor (DSP) or any other digital or analog circuitry configured to execute processing instructions stored in memory 34. Memory 34 may be random access memory (RAM), electrically erasable programmable read-only memory (EEPROM), a PCMCIA card, flash memory, or any suitable selection and/or array of volatile or non-volatile memory that retains data after the power to computer system 30 is turned off. Display device 36 may be a liquid crystal device, cathode ray tube, or other display device suitable for creating graphic images and alphanumeric characters recognizable to a user.

In operation, processing instructions are stored in memory 34. Processing resource 32 accesses memory 34 to retrieve the processing instructions and perform various functions included in the processing instructions. In one embodiment, the processing instructions may include a placement tool, a design rule fix (DRF) tool and a layout versus schematic (LVS) tool. The placement tool may identify regions in a mask layout file including an antenna ratio that is lower than a design rule from a technology file, automatically add a grounding feature to the identified areas and connect the grounding feature to a gate feature (e.g., polysilicon located over diffusion) in the mask layout file. The DRF tool may eliminate existing design rule violations and prevent violations from being created during the placement of the grounding features. The LVS tool may correct any existing connectivity errors and prevent other errors from being created when the grounding features are connected in the mask layout file.

The placement tool may analyze the pattern in the mask layout file to identify regions that have a low antenna ratio and, therefore, require the addition of a grounding feature to reduce or eliminate the possibility of antenna effects from occurring during fabrication of an integrated circuit. In one embodiment, a region may have a low antenna ratio if the amount of polysilicon located over diffusion (e.g., a polysilicon gate of a transistor) is small compared to the amount of polysilicon located over field oxide (e.g., a polysilicon interconnect between one or more transistors) for a single node. In another embodiment, a region may have a low antenna ratio if the amount of polysilicon located over diffusion is small compared to the amount of metal connected to the polysilicon gate (e.g., a metal interconnect between one or more transistors). The metal may be any layer of metal used to create the integrated circuit.

Once the placement tool has identified a region where the antenna ratio is lower than a corresponding design rule in a technology file associated with a specific manufacturing process, the placement tool determines if the identified region includes a space that will accommodate the grounding feature. In one embodiment, the space may already exist in the identified region. In this example, the placement tool may size the grounding feature to fit in the space in the identified region and automatically connect the grounding feature to a gate feature using the DRF and LVS tools to respectively prevent design rule violations from occurring and maintain the connectivity for the node associated with to the gate feature.

In another embodiment, the placement tool may determine that the identified region does not include a space to place a grounding feature. In this example, the placement tool may analyze the identified region and areas surrounding the identified region to determine if one or more features located in the identified region can be repositioned within the mask layout file to create a space for the grounding feature. The placement tool may calculate the size of the grounding feature needed to protect the polysilicon gate during fabrication of an integrated circuit. Based on this calculation, the placement tool may determine the number of features that should be moved to create a space for the grounding feature. For example, the placement tool may determine that all of the features representing a logic function, such as a NAND or a NOR logic function, should be moved. The placement tool may create appropriate breaks in the electrical connections for the logic function and remove the features associated with the logic from the identified region.

In one embodiment, the placement tool may determine that a space to move the features from the identified region exists in the mask layout file inside or near the identified region. In another embodiment, the placement tool may create a space to move the features by using a compaction algorithm to reduce the dimensions (e.g., the widths or lengths of the features and/or the spaces between features) of certain features in the mask layout file. The placement tool first compares spacing between the features in the mask layout file to the corresponding design rule in the technology file. If any of the spacings are greater than the corresponding design rules, the placement tool attempts to reduce the dimensions of the features such that the dimensions are approximately equal to the corresponding minimum design rules contained in the technology file. During compaction, the placement tool may invoke the DRF tool to access the design rules for compacting the mask layout file and to prevent design rule violations from being created.

The DRF tool may eliminate and prevent design rule violations during placement of the grounding feature by using any commercially available design rule check (DRC) tool to compare feature dimensions in a mask layout file with design rules for a desired manufacturing process. The design rules may be included in a technology file that is used by the DRC tool and may represent the minimum and/or maximum allowable feature dimensions (e.g., spaces between features and widths and lengths of features) for the desired manufacturing process. If the feature dimensions in the mask layout file are greater than or equal to the minimum design rules, the DRC tool may generate an output file indicating that the mask layout file does not include any design rule violations.

If the DRC tool determines that at least one feature dimension in the mask layout file is less than a corresponding design rule in the technology file, the DRC tool may generate an output file that contains any identified design rule violations. The output file may be used by the DRF tool to locate the coordinates of the features in the mask layout file that are associated with the design rule violations. The DRF tool may automatically adjust the feature dimension of spaces between features or the length and/or width of the features until the feature dimension is approximately equal to or greater than the corresponding design rule in the technology file.

In one embodiment, changes to the mask layout file may create new design rule violations that are associated with features surrounding the edited features. The DRF tool, therefore, analyzes any changes to the mask layout file to ensure that no additional design rule violations are created. Once the DRF tool determines that the changes to the mask layout file do not create additional design rule violations, the DRF tool repositions the features associated with the original design rule violations. In one embodiment, the DRF tool may reposition one or more edges of the features in the mask layout file. The DRF tool also maintains connectivity in the mask layout file by adding features to and/or subtracting features from any connections that may be affected when the features associated with the design rule violation are repositioned in the mask layout file. The DRF tool individually locates and corrects all of the design rule violations identified in the output file until the mask layout file is free of design rule violations.

Once the space in the mask layout file has been created to move the features from the identified region, the placement tool creates a break in electrical connections associated with the features to be moved and moves the features between the created breaks to the new position in the mask layout file. After placing the moved features in the new position, the placement tool automatically determines the appropriate routing paths from the moved features to the appropriate nodes in the identified region. The placement tool uses the DRF tool to prevent design rule violations from being created when the moved features are placed in the new position. To determine the routing paths from the nodes in the identified region, the placement tool determines if electrical connections may be created from the moved features to the breaks created in the identified region. If the electrical connections may be created, the placement tool adds features to the mask layout file on the appropriate layers between the moved features and the breaks in the identified region.

In order to prevent connectivity errors and maintain the correct connections when routing the electrical connections between the breaks in the identified region and the moved features, the placement tool may also invoke the LVS tool. The LVS tool may compare logical connections contained in a netlist generated from a schematic diagram of an integrated circuit with electrical connections contained in a mask layout file generated from a corresponding layout block for the integrated circuit. If the electrical connections in the mask layout file match the logical connections in the netlist, the LVS tool may generate an output file that indicates the mask layout file does not include any connectivity errors.

However, if at least one electrical connection in the mask layout file does not match the corresponding logical connection in the netlist, the LVS tool may generate an output file that contains any connectivity errors identified by the LVS tool in the mask layout file. This output file is then used to locate the electrical connections in mask layout file that do not match the corresponding logical connections in the netlist. The LVS tool automatically deletes the mismatched connections. In one embodiment, the LVS tool removes all of the features associated with the mismatched connection. In another embodiment, the LVS tool creates a break point in the mismatched connections and removes the features between the break point and the mismatched node.

In one embodiment, the LVS tool may use the output file to locate and match nodes in the mask layout file that correspond to the nodes in the netlist. The LVS tool then automatically generates and routes the electrical connections between the appropriate nodes. The electrical connections are routed though the mask layout file without creating any design rule violations in the mask layout file. The process is performed on all mismatched connections and all connectivity errors are removed from the mask layout file.

Once the features in the identified region have been moved and the DRF and LVS tools have verified that no design rule violations exist and the connectivity is correct, the placement tool adds a grounding feature in the space created in the identified region. The placement tool then connects the grounding feature to the gate feature. In one embodiment, the grounding feature may be a diffusion diode. In another embodiment, the grounding feature may be a metal interconnect feature used to replace a portion of a polysilicon over field feature. During the grounding feature placement process, the placement tool may use the DRF and LVS tools to ensure that no design rule violations or connectivity errors are introduced when the grounding features are placed in the mask layout file.

In another embodiment, the placement tool may determine that features surrounding a gate feature with a low antenna ratio in the identified region cannot be moved to create a space in the identified region for a grounding feature. The placement tool may then determine if the grounding feature may be placed in a space outside of the identified region. If the placement tool locates an appropriate space, the placement tool may add a grounding feature in the mask layout file in the space located outside of the identified region, determine a routing path to the gate feature in the identified region, and create an electrical connection between the grounding feature and the gate feature. The placement tool may further use the DRF and LVS tools during placement of the grounding feature and routing of the electrical connection.

In some embodiments, the processing instructions for correcting design rule violations in a mask layout file may be encoded in computer-usable media. Such computer-usable media may include, without limitation, storage media such as floppy disks, optical disks, hard disks, CD-ROMs, DVDs, read-only memory, random access memory and magnetic or optical cards; as well as communications media such wires, optical fibers, microwaves, radio waves, and other electromagnetic or optical carriers.

Figure 3:
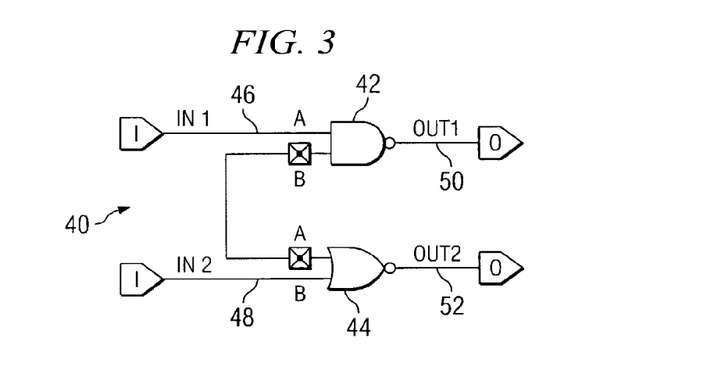
FIG. 3 illustrates a schematic diagram of an example integrated circuit formed in accordance with teachings of the present invention.

FIG. 3 illustrates schematic diagram 40 of an integrated circuit that includes NAND 42 and NOR 44. NAND 42 may include two inputs, labeled a and b and NOR 44 may include two inputs, labeled a and b. In the illustrated embodiment, node 46, labeled in1, is connected to input a of NAND 42, node 48, labeled in2, is connected to input b of NOR 44, and input b of NAND 42 is connected to input a of NOR 44. Output 50 of NAND 42 is labeled out1 and output 52 of NOR 44 is labeled out2. In another embodiment, NAND 42 and NOR 44 may have more than two inputs and the circuit may be connected in any suitable way. In other embodiments, an integrated circuit may include other logical elements, including, but not limited to, inverters, AND gates, OR gates, XOR gates and XNOR gates, and complex circuits, such as adders, latches, flip-flops, multiplexers, registers, memory cells, programmable logic arrays (PLAs) and any other type of circuitry that may be used to form an integrated circuit.

In order to verify that the logic elements and associated connections perform the desired function, a netlist may be generated of the integrated circuit in schematic diagram 40. The netlist may include a list of transistors, such as P-MOSFETS and N-MOSFETS that form the integrated circuit, nodes associated with the integrated circuit (e.g., nodes 46 and 48 and outputs 50 and 52 and any connections to power and ground) and the logical connections between the nodes. A verification tool may be used to verify that the logical connections are correct and the verified netlist may be stored in memory 34 for use by other applications.

Figure 4:
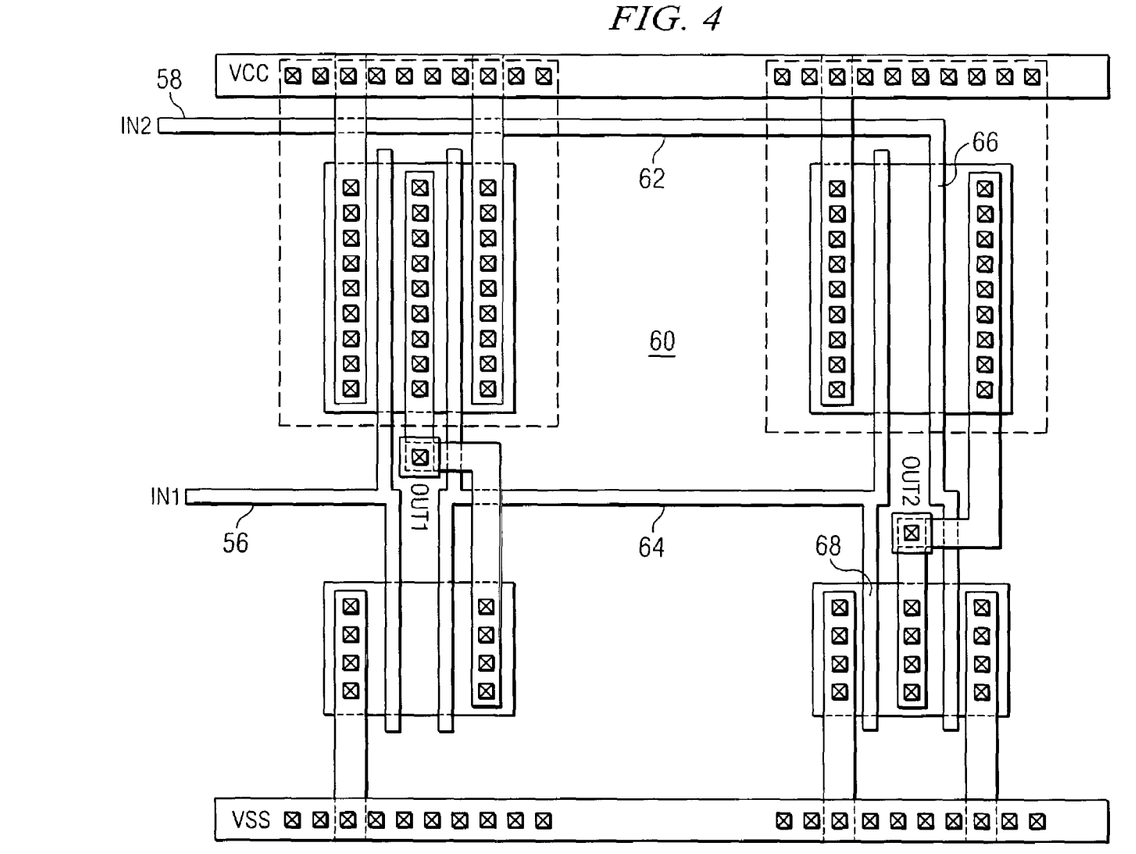
FIG. 4 illustrates a layout view of the example integrated circuit of FIG. 3 formed in accordance with teachings of the present invention.

FIG. 4 illustrates layout block 54 that represents the integrated circuit shown in schematic diagram 40 of FIG. 3. Layout block 54 includes polygons that form NAND 42 and NOR 44. Node 56 corresponds to node 46 in schematic diagram 40 and node 58 corresponds to node 48 in schematic diagram 40. The integrated circuit may be represented by polygons drawn on different layers, including but not limited to, n-well, p-well, diffusion, polysilicon, metal one contacts, metal one, metal two contacts, and metal two. In another embodiment, the integrated circuit may include the layers shown in FIG. 4 in addition to one or more additional polysilicon layers, one or more additional metal layers and any contact layers that correspond to the additional metal layers.

A mask layout file may be generated from layout block 54 and analyzed by a placement tool to determine regions that may require a grounding feature in order to eliminate antenna effects when a pattern is formed on a semiconductor wafer. As illustrated in FIG. 4, layout block 54 may contain region 60 where the placement tool determines that grounding features should be added to polygons 62 and 64. Polygons 62 and 64 may be located over field oxide and may be respectively connected to gates 66 and 68 that are located over diffusion. The placement tool may use design rules included in a technology file associated with a specific manufacturing process to determine if the ratio the area of gate 66 and the area of polygon 62 is less than the minimum allowed ratio in the technology file. The placement tool performs a similar analysis for polygon 64 and gate 68. If the placement tool determines that either ratio is less than the minimum ratio contained in the technology file, the placement tool may generate an output file indicating the a grounding feature should be placed in an identified region of the mask layout file in order to eliminate antenna effects during fabrication of the integrated circuit.

Figure 5:
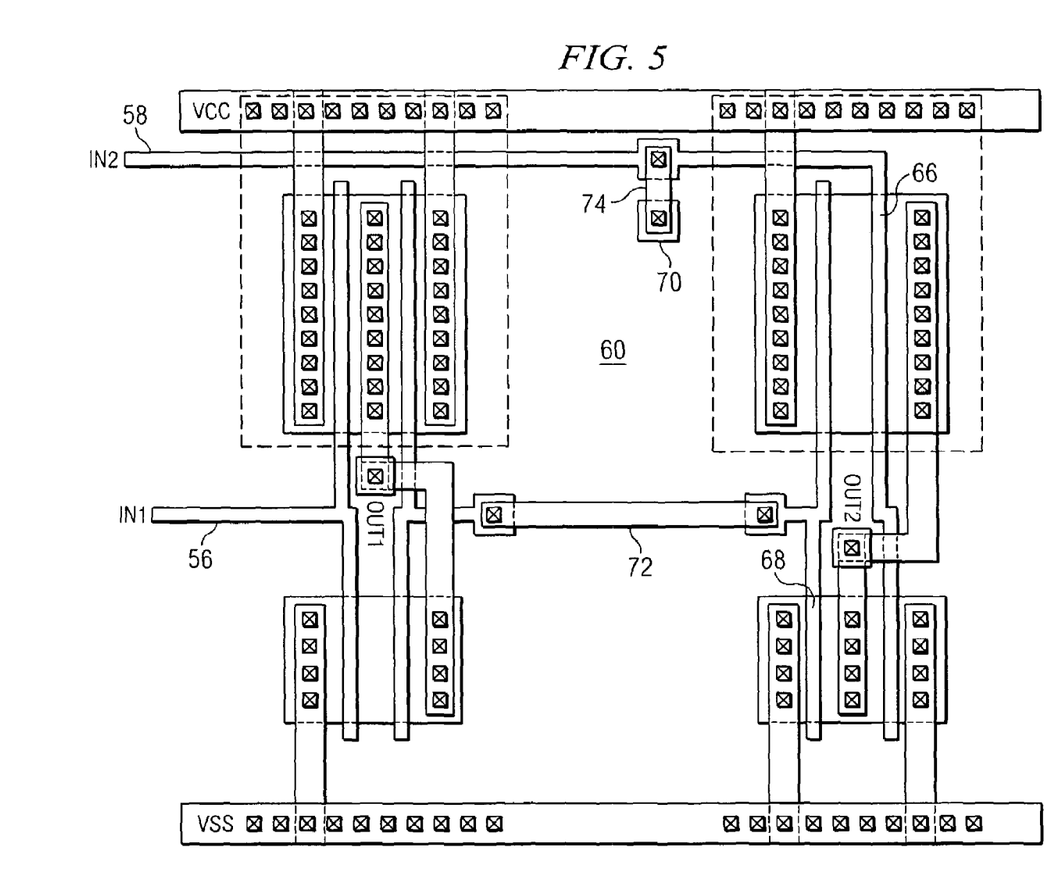
FIG. 5 illustrates a layout view of the example integrated circuit of FIG. 3 after placement of grounding features in a mask layout file.

FIG. 5 illustrates layout block 54 after the placement tool has added grounding features to a mask layout file. In one embodiment, the placement tool may analyze the mask layout file and determine that grounding features 70 and 72 should be placed in region 60 to eliminate antenna effects during fabrication of the integrated circuit represented by layout block 54. The placement tool may generate an output file indicating where grounding features 70 and 72 should be placed in mask layout block 54. The output file may be used by a layout designer to manually add grounding features 70 and 72 to mask layout block 54 or by the placement tool to automatically place grounding features 70 and 72 in the mask layout file.

Once the placement tool identifies region 60, grounding features 70 and 72 may be used to increase the antenna ratio for gates 66 and 68. In the illustrated embodiment, grounding feature 70 is a diffusion diode created from polygons representing the diffusion layer, the metal one contact layer and the metal one layer that provides a path for a charge that may be collected in gate 66 to diffuse into the substrate. Grounding feature 72 is a combination of metal one polygons that reduce the area of polysilicon over field oxide directly connected to gate 68.

In the illustrated embodiment, region 60 does not include any polygons to be moved by the placement tool and grounding features 70 and 72 may be placed directly in region 60. During placement of grounding features 70 and 72, the placement tool may use a compaction algorithm to reduce the dimensions of the polygons in mask layout block 54 such that the dimensions of the polygons are approximately equal to the corresponding minimum design rules. The placement tool may also invoke a DRF and/or LVS tool to ensure that placing grounding features 70 and 72 does not create design rule violations or disrupt the connectivity associated with gates 66 and 68.

Once grounding features 70 and 72 are added to the mask layout file, the placement tool connects grounding features 70 and 72 to the appropriate nodes in region 60. For example, grounding feature 70 may be connected to gate 66 by electrical connection 74. Electrical connection 74 may be formed from polygons on any layer suitable to provide a connection between grounding feature 70 and gate 66. In the illustrated embodiment, electrical connection 74 may be formed from polygons representing the metal one layer. During routing of the electrical connections, the placement tool may use the DRF tool and the LVS tool to ensure that the mask layout file is free of design rule violations and all of the electrical connections between various nodes are maintained.

In one embodiment, layout block 54 may be a subcell in a hierarchical design and may be repeated multiple times in a top-level cell. In this example, the placement tool may identify region 60 in one instance of the subcell. Since each instance of the subcell may include identical polygons, a change to the polygons in one subcell may affect all instances of the subcell. The placement tool, therefore, may add grounding features 70 and 72 in one subcell and all other instances may be globally changed throughout the mask layout file. Once the grounding features 70 and 72 are added in the subcells, the placement tool may invoke a DRF tool to check a top-level structure and determine if the changes to the subcells caused any violations in the top-level structure or if any grounding features should be added to the top-level structure. If the DRF tool identifies any violations in the top-level structure, the DRF tool corrects the violations at the top-level and then verifies that the corrections did not effect any of the subcells.

The placement tool may also determine if ground features should be added to the top-level cell. If the placement tool determines that grounding features should be added to the top-level structure, the placement tool places the appropriate grounding features and uses the DRF and LVS tools to respectively determine if the additional grounding features caused any design rule violations or connectivity errors in the subcells.

Figure 6A:
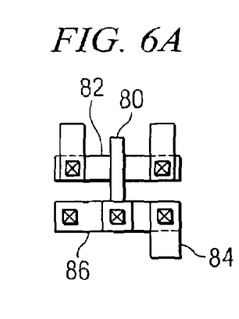
FIGS. 6A and 6B illustrate layout views of other example integrated circuits after placement of grounding features in a mask layout file in accordance with teachings of the present invention.
Figure 6B:
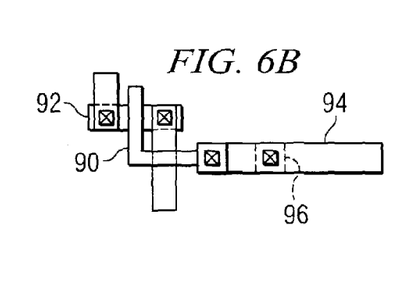

FIGS. 6A and 6B illustrate layout views of other example integrated circuits after placement of grounding features in the mask layout file. Specifically, FIG. 6A illustrates gate 80, diffusion 82, interconnect polygon 84 and diffusion diode 86. In one embodiment, the placement tool may use a technology file associated with a specific manufacturing process to determine if a grounding feature should be added to the mask layout file. For example, the technology file may include design rules for antenna ratios between the area of polysilicon over diffusion and the area of any metal layer over field oxide, except the metal one layer, that may be directly connected to the polysilicon. In the illustrated embodiment, the placement tool may determine that interconnect polygon 84, which is formed from a metal one polygon, a metal two contact polygon and a metal two polygon, will create an antenna effect during fabrication because the area of metal two over field oxide is too large compared to the area of gate 80. Since the metal two polygon is directly connected to gate 80, the placement tool may determine that the ratio between gate 80 and the metal two portion of interconnect polygon 84 is less than a design rule in the technology file. The placement tool locates a space, places diffusion diode 86 in the mask layout file and connects diffusion diode 86 to gate 80.

FIG. 6B illustrates gate 90, diffusion 92, interconnect polygon 94 and diffusion diode 96. In this example, the technology file may include design rules for antenna ratios between the area of polysilicon over diffusion and the area of any metal layer over field oxide that is directly connected to the polysilicon. In the illustrated embodiment, the placement tool may determine that interconnect polygon 94, which is formed from a metal one polygon, will create an antenna effect during fabrication. Since the metal one polygon is directly connected to gate 90, the placement tool may determine that the ratio between gate 90 and interconnect polygon 94 is less than a design rule in the technology file. The placement tool locates an appropriate portion of interconnect polygon 84 to place diffusion diode 86. In the illustrated embodiment, diffusion diode 86 is formed from a diffusion polygon and a metal one contact and provides a path to the substrate (e.g., a semiconductor wafer) for a charge that may accumulate in gate 90 during fabrication of an integrated circuit.

Figure 7A:
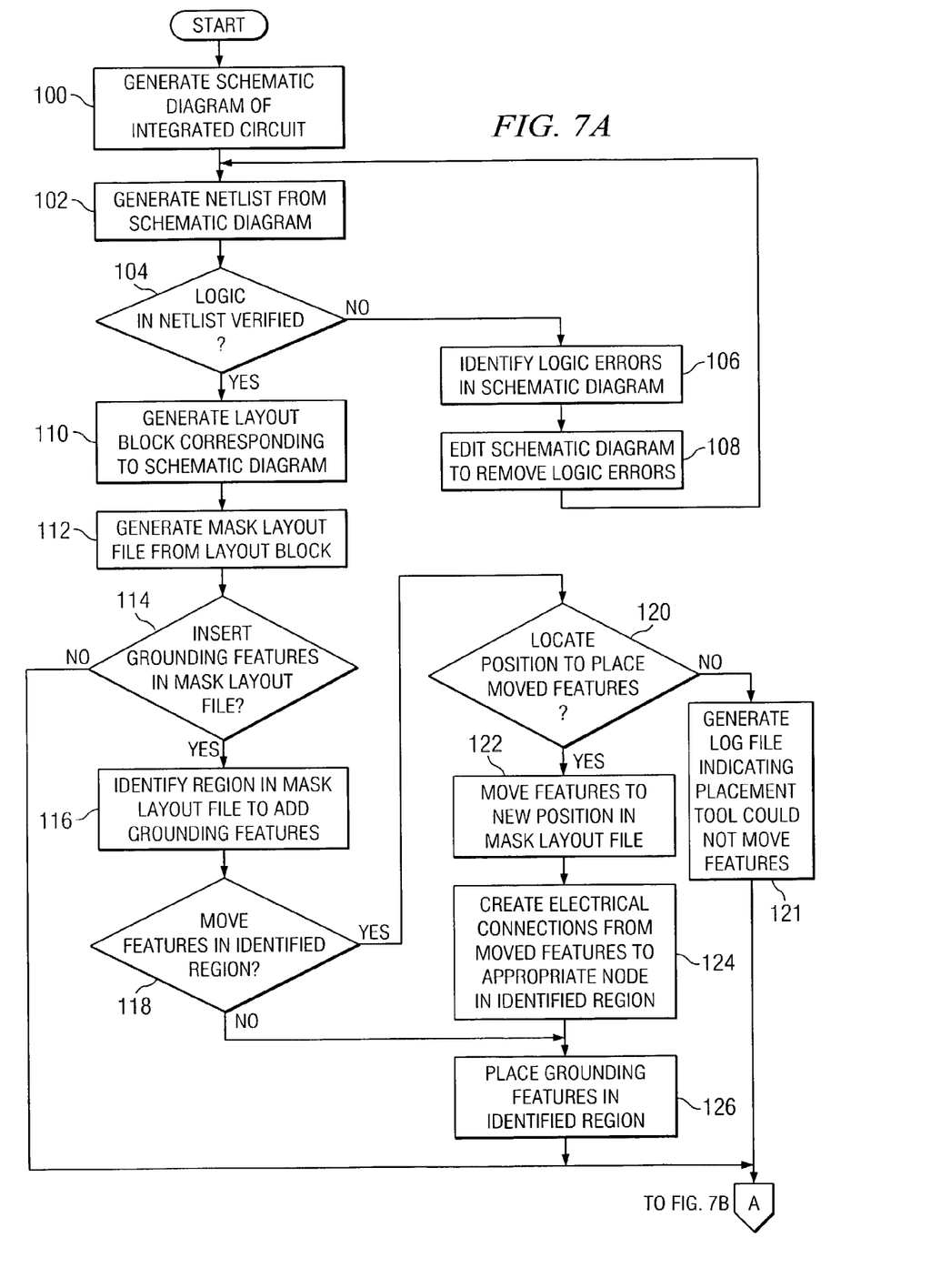
FIGS. 7A and 7B illustrate a flow chart for one example of a method for generating a mask layout file to eliminate antenna effects in an integrated circuit in accordance with teachings of the present invention.
Figure 7B:
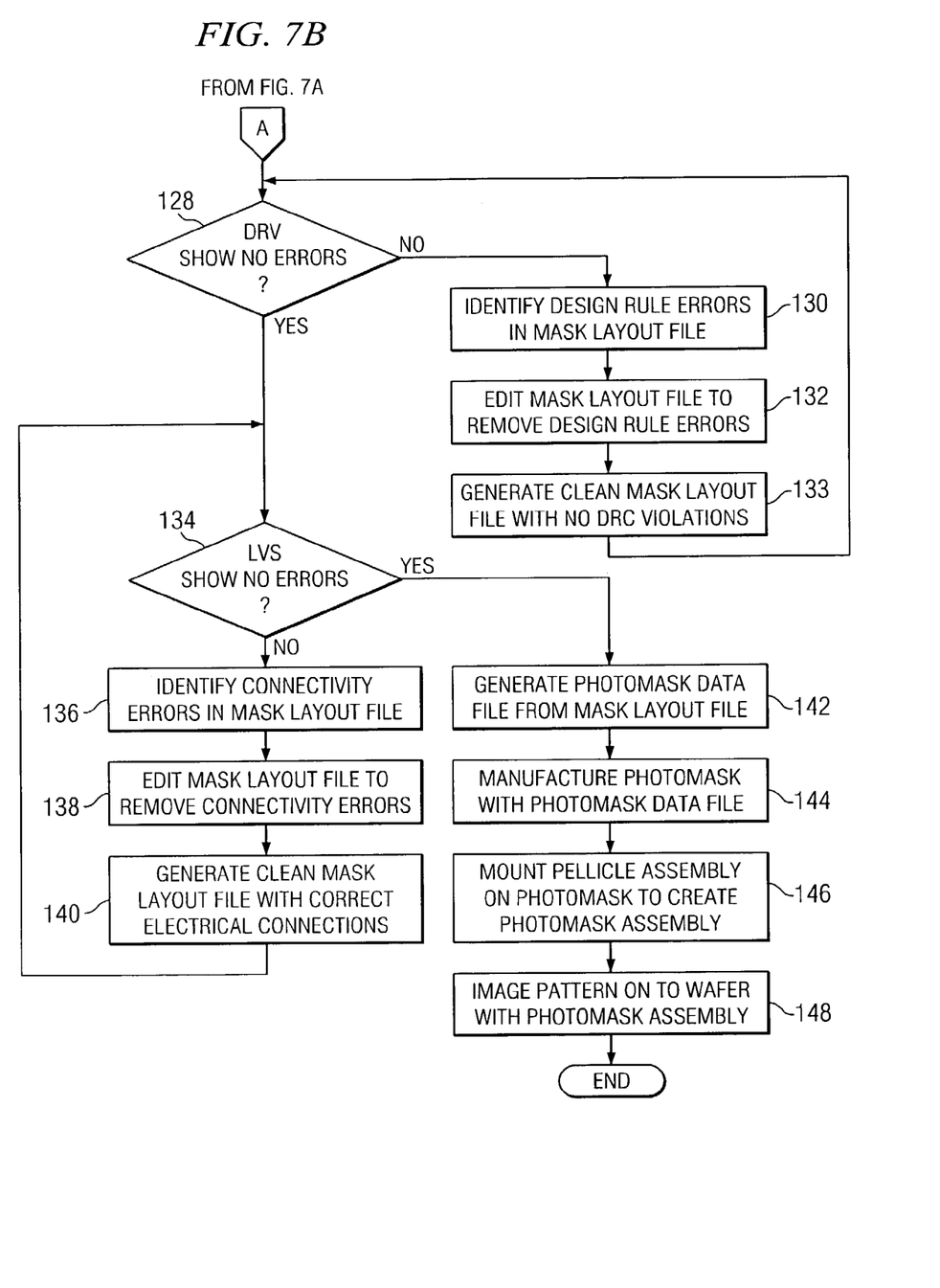

FIGS. 7A and 7B illustrate a flow chart of a method for generating a mask layout file to eliminate antenna effects in an integrated circuit. Generally, a mask layout file including a pattern that represents a circuit image is analyzed to identify regions where grounding features should be placed to eliminate antenna effects that may occur during fabrication of the integrated circuit. A placement tool determines if features in the region should be moved to a new position in order to create a space for the grounding features. Once the space has been created, the placement tool automatically adds the grounding features to the mask layout file and connects the grounding features to the appropriate polysilicon gates. The placement tool also accesses a design rule fix (DRF) tool and a layout versus schematic (LVS) tool to ensure that the added grounding features do not create any design rule violations and that connectivity of the electrical connections in the pattern is maintained.

As illustrated in FIG. 7A, a circuit designer creates schematic diagram 40 for an integrated circuit at step 100. Schematic diagram 40 may be generated manually by the circuit designer or with a synthesis tool that creates a schematic diagram by using an input file, such as a high-level design language (HDL) file. The HDL file may include both behavioral descriptions and structural descriptions for the integrated circuit. Once schematic diagram 40 is complete, a netlist may be generated from schematic diagram 40 at step 102. The netlist may include definitions of the generic cell logic functions and the connections between the various logic functions. In one embodiment, the netlist may be a flat netlist that defines all of the logic and connections at one level. In another embodiment, the netlist may be a hierarchical netlist that contains top-level cells and one or more sub-cells that can be used in any of the top-level cells. The netlist may be generated from CAD tools developed by Cadence, Synopsis, Mentor Graphics or any other company that provides software and/or hardware for generating a netlist from a schematic diagram.

At step 104, the netlist may be tested by a verification tool to determine if schematic diagram 40 includes the correct circuits and logical connections to perform a desired function. If the netlist contains logic errors, the verification tool may generate an output file that contains a list of the logic errors at step 106. The output file may be used to correct errors in the logic and/or errors in the connections between the logic in schematic diagram 40 at step 108. The corrections may be made manually by the circuit designer or the output file may be used by a synthesis tool to automatically correct the errors and insert the correct logical elements and/or connections. Once the corrections have been made, a clean netlist is generated for logic verification at step 102.

If the verification tool determines that the netlist does not contain any logic errors, layout block 54 that represents the integrated circuit shown in schematic diagram 40 is created at step 110. Layout block 54 may be created manually by a layout designer using CAD tools developed by Cadence, Synopsis, Mentor Graphics, or any other company that develops integrated circuit layout tools, or automatically by a synthesis tool. Layout block 54 may include polygons located on different layers that form the transistors and electrical connections for the integrated circuit. The layers in layout block 54 may include, but are not limited to, n-well, p-well, diffusion, one or more polysilicon layers, any suitable number of metal layers and the associated contacts or vias that provide connections between the different layers.

When layout block 54 is complete, an initial mask layout file is generated at step 112. The mask layout file contains data regarding the geometry and interconnections of the integrated circuit represented in layout block 54. This data may be stored in the GDSII format, CIF format, DFII format, or any other suitable format for data that may describe the geometry and interconnections of integrated circuits. Similar to the schematic netlist, the mask layout file may be flat or hierarchical. In a hierarchical design, a top-level structure includes specific references to one or more levels of subcells. The references include all geometry and connectivity information that are contained within each of the subcells. Any top level structures and the associated subcells may also include local geometry and connectivity information that represent circuitry that is logically situated within the top level structure but not included in any referenced subcell.

At step 114, a placement tool analyzes the mask layout file to determine if grounding features should be added to the pattern in order to eliminate antenna effects when fabricating an integrated circuit. If the placement tool determines that there is a need for grounding features, the placement tool identifies one or more regions in the mask layout file that may require placement of grounding features at step 116. The placement tool may identify regions in the mask layout file that require grounding features by comparing an antenna ratio for polysilicon over diffusion (e.g., a gate region of a transistor) to a design rule in a technology file for a specific manufacturing process. In one embodiment, the antenna ratio may be the ratio of an area of gate region to an area of polysilicon or metal interconnect over field oxide connected to the gate region. The placement tool calculates the antenna ratio for a gate region in an identified area and determines if the antenna ratio is less than the design rule in the technology file.

Once a region in the mask layout file has been identified, the placement tool determines if features in the identified region should be moved to create a space for the grounding features at step 118. In one embodiment, the placement tool may determine that a subset of features forming a logic function (e.g., a NAND or NOR function) should be moved to create the space for the grounding feature. In another embodiment, the placement tool may determine that all of the features forming the logic function should be moved.

At step 120, the placement tool determines if the features can be moved to an area inside the identified region or an area close to the identified region. In one embodiment, the placement tool searches for spaces in the mask layout file that are in or near the identified region and are large enough to contain the features to be moved. In another embodiment, the placement tool searches for portions of the pattern in the mask pattern file that may be rearranged in order to create a space for the moved features.

If the placement tool cannot move the features to create a space for the grounding features, the placement tool creates a log file at step 121. The log file may include coordinates in the mask layout file for the identified regions where the placement tool could not create a space to add a grounding feature. The log file may be used by a CAD tool executing on computer system 30 and the regions where the grounding feature could not be placed may be displayed for a layout designer within layout block 54 on display device 36.

If the placement tool locates an area in the mask layout file to move the features from the identified region, the placement tool moves the features to the new position at step 122. In one embodiment, the placement tool may determine that the feature dimensions in the identified regions and any features surrounding the identified regions are greater than the minimum design rules. The placement tool may use a compaction algorithm to reduce the dimensions of the features to be approximately equal to the minimum design rules from an associated technology file. In another embodiment, the placement tool may rearrange features at the new position in order to create the space for the moved features. In either embodiment, the placement tool may invoke the DRF and LVS tools to prevent any design rule violations from being created and to maintain the correct connectivity for the moved features. The features may be moved to a different position on the same layer (e.g., a metal one feature is relocated to a new position on the metal one layer) or the features may be moved to a different layer in the mask layout file (e.g., a metal one feature is relocated to the new position in the mask layout file but on the metal two layer).

Once the placement tool moves the features from the identified region to the new position in the mask layout file, the placement tool connects the moved features to the appropriate nodes in the identified region at step 124. The placement tool first determines a routing path from the moved features to the appropriate nodes in the identified regions. Once the routing path has been determined, the placement tool creates an electrical connection by adding features to the mask layout file on the appropriate metal layers. For example, the placement tool may connect a polysilicon feature inside the identified region to a polysilicon feature outside of the identified region. In one embodiment, the placement tool may add metal one contact features and metal one features. In another embodiment, the placement tool may add features representing layers above the metal one layer in order to create the electrical connection.

Once the electrical connections have been created or the placement tool determines that no features in the identified regions need to be moved, the placement tool adds a grounding feature to a gate feature in the identified region at step 126. In one embodiment, the placement tool may select a grounding feature from a standard cell library that includes multiple grounding features having predetermined sizes. In another embodiment, the placement tool may size the grounding feature to fit the space allocated in the identified area or create the grounding feature to have any size less than the allocated space.

As illustrated in FIG. 6B, a DRC tool, which is integrated in the DRF tool, determines if there are any design rule violations in the generated mask layout file at step 128. A design rule violation may include, but is not limited to, less than minimum spacing between features on the same or different layers in layout block 54 or less than the minimum and/or maximum dimensions for the features on the various layers. The DRC tool compares the spacing between features and/or dimensions of the features in the mask layout file with the corresponding design rules for a desired manufacturing process. If a design rule violation is identified, the DRC tool includes the design rule violation in an output file at step 130. In one embodiment, the output file may be used by a CAD tool executing on computer system 30 and the violations may be displayed for a layout designer within layout block 54 on display device 36.

At step 132, a DRF tool may automatically correct the design rule violation in the mask layout file. In one embodiment, the DRF tool may move all features associated with the design rule violation in order to increase the dimensions of the features associated with the violation. In another embodiment, the DRF tool may move only one feature associated with the design rule violation to increase the feature dimensions. In a further embodiment, the design rule violation may be caused by a feature dimension that is less than a minimum dimension in the technology file. In this example, the DRF tool may increase the feature dimension by repositioning edges of the features associated with the design rule violation.

In an additional embodiment, the DRF tool may move a feature from one layer to another layer in order to correct the design rule violation. For example, a change to a feature associated with a design rule violation may create a new design rule violation. If the features on a particular layer cannot be moved to correct the design rule violation, the DRF tool may move a feature from its original layer to a layer above or below the original layer in order to remove the design rule violation and maintain connectivity in the mask layout file. Once the design rule violation has been removed from the mask layout file, the DRF tool determines if any features should be added to electrical connections in order to maintain connectivity. The addition of new features and the increase in distance between certain features may cause the size of layout block 54 to increase. The DRF tool may also reduce the size of the mask layout file by compacting the layout so that the spacing between the features on the same or different layers is approximately equal to the minimum spacing allowed for a specific manufacturing process. Since the compaction process uses design rules from the technology file, no design rule violations are introduced into the mask layout file.

Once the design rule violations have been removed from the layout block, a clean mask layout file is generated at step 133. The clean mask layout file may be free of design rule violations and may include the minimum spacing between features and minimum widths for features for a specific semiconductor manufacturing process. The clean mask layout file is then checked by the DRF tool to verify that the design rule violations have been eliminated at step 128. In one embodiment, the DRF tool may incrementally check the spacing between features and feature dimensions in the mask layout file such that the DRF tool only checks the portions of the mask layout file that were changed.

If no design rule violations are found, a layout versus schematic (LVS) tool is used to determine if there are any connectivity mismatches between the netlist and the mask layout file at step 134. The LVS tool compares logical connections in the netlist to the corresponding electrical connections in the mask layout file to identify any errors. If the LVS tool determines that connectivity errors are present in the mask layout file, an output file is generated that includes at least one connectivity error at step 136. In one embodiment, the CAD tool, such as a layout editor, executing on computer system 30 reads the output file and displays the connectivity errors for the layout designer within layout block 54 on display device 36.

At step 138, the connectivity errors may be removed from the mask layout file by using the output file. In one embodiment, a layout designer may manually correct the connectivity errors within layout 54 based on identifying marks provided by a layout editor. In this example, the layout designer may click on an error listed in the output file to load the error into the layout editor. In another embodiment, the LVS tool may automatically correct the connectivity errors in the mask layout file by using the output file. In this example, the LVS tool may remove all features associated with a mismatched electrical connection from the mask layout file or create a break point in the mismatched connection and remove all features associated with the mismatched connection between the break point and the mismatched node. Once the features have been removed, the LVS tool may locate the correct node in the mask layout file and determine a routing path for the matching electrical connection. The LVS tool routes the matching electrical connection in any appropriate layer (e.g., polysilicon and/or any suitable layer of metal) within the mask layout file.

Once all connectivity errors have been removed from the mask layout file, a clean mask layout file is generated at step 140. If the LVS tool determines that the mask layout file does not include any connectivity errors, a photomask data file is generated from the mask layout file at step 142. Multiple photomask data files may be generated to represent the different layers in layout block 54. For example, one photomask data file may contain information for a photomask to be used during the diffusion step of the manufacturing process and a separate photomask data file may contain information for a photomask to be used to form the polysilicon gates of an integrated circuit. At step 144, each of the photomask data files is used in a lithography system to create a photomask for each layer of an integrated circuit.

In an alternative embodiment, the data files may be prepared to use in a lithography system for a semiconductor wafer in order to directly write the pattern from the data file onto a resist layer formed on the semiconductor wafer. Each data file may contain information for one layer of the integrated circuit.

At step 146, a pellicle assembly may be mounted on the photomask to create a photomask assembly. The pellicle assembly may prevent contaminants from landing on the surface of the photomask. Once the photomask assembly is created, the photomask assembly may be used in a lithography system to image the pattern from the photomask on to a semiconductor wafer at step 148. A different photomask may be used for each layer of the integrated circuit until all layers of the integrated circuit have been fabricated on a semiconductor wafer. In one embodiment, a typical integrated circuit may be fabricated by using between approximately ten and approximately thirty photomasks.

Although the present invention has been described with respect to a specific preferred embodiment thereof, various changes and modifications may be suggested to one skilled in the art and it is intended that the present invention encompass such changes and modifications fall within the scope of the appended claims.

What is claimed is:

1. A photomask, comprising:
   a substrate; and
   a patterned layer formed on at least a portion of the substrate, the patterned layer formed using a mask pattern file created by:
      analyzing a pattern in a mask layout file to identify a region including an antenna ratio less than a first design rule;
      moving a feature located in the identified region from a first position to a second position in the mask layout file to create a space in the identified region for placing a grounding feature, the second position selected by using a second design rule to prevent a physical layout violation from being created when moving the feature from the identified region;
      placing the grounding feature in the space; and
      automatically connecting the grounding feature to a gate feature in the mask layout file such that the antenna ratio is increased to greater than or approximately equal to the first design rule.

2. The photomask of claim 1, wherein the antenna ratio comprises a ratio of a polysilicon over diffusion area to a polysilicon over field area.

3. The photomask of claim 1, wherein the antenna ratio comprises a ratio of a polysilicon over diffusion area to a metal over field area.

4. The photomask of claim 1, wherein connecting the grounding feature to the gate feature comprises:
   creating a break in a polysilicon feature connected to the gate feature, the break separating the polysilicon feature and the gate feature; and
   connecting the gate feature and the polysilicon feature with a metal feature.

5. The photomask of claim 1, wherein the grounding feature comprises a diffusion diode.

6. The photomask of claim 5, wherein connecting the grounding feature to the gate feature comprises connecting the diffusion diode to a metal feature connected to the gate feature.

7. The photomask of claim 1, wherein moving the feature comprises maintaining connectivity associated with the moved feature.

8. The photomask of claim 1, further comprising the patterned layer formed by compacting the pattern in the mask layout file in order to move the feature.

9. The photomask of claim 1, wherein moving the feature comprises moving the feature from a first layer to a second layer.

10. The photomask of claim 1, further comprising the patterned layer formed by:
    placing the grounding feature outside of the identified region; and
    creating an electrical connection from the grounding feature to the gate feature in order to maintain connectivity.

11. A photomask assembly, comprising:
    a pellicle assembly defined in part by a pellicle frame and a pellicle film attached thereto; and
    a photomask coupled to the pellicle assembly opposite from the pellicle film, the photomask including a patterned layer formed on a substrate, the patterned layer formed using a mask pattern file created by:
       analyzing a pattern in a mask layout file to identify a region including an antenna ratio less than a first design rule;
       moving a feature located in the identified region from a first position to a second position in the mask layout file to create a space in the identified region for placing a grounding feature, the second position selected by using a second design rule to prevent a physical layout violation from being created when moving the feature from the identified region;
       placing the grounding feature in the space; and
       automatically connecting the grounding feature to a gate feature in the mask layout file such that the antenna ratio is increased to greater than or approximately equal to the first design rule.

12. The photomask assembly of claim 11, wherein the antenna ratio comprises a ratio of a polysilicon over diffusion area to a polysilicon over field area.

13. The photomask assembly of claim 11, wherein the antenna ratio comprises a ratio of a polysilicon over diffusion area to a metal over field area.

14. The photomask assembly of claim 11, wherein the grounding feature comprises a diffusion diode.

15. The photomask assembly of claim 11, wherein moving the feature comprises maintaining connectivity associated with the moved feature.

16. The photomask assembly of claim 11, further comprising the patterned layer formed by compacting the pattern in the mask layout file in order to move the feature.

17. An integrated circuit formed on a semiconductor wafer, comprising:
   a plurality of interconnect layers selected from a group consisting of n-well, p-well, diffusion, polysilicon and metal; and
   a plurality of contact layers operable to provide electrical connections between the interconnect layers;
   the interconnect and contact layers formed on a semiconductor wafer using a plurality of photomasks created by:
      analyzing a pattern in a mask layout file to identify a region including an antenna ratio less than a first design rule;
      moving a feature located in the identified region from a first position to a second position in the mask layout file to create a space in the identified region for placing a grounding feature, the second position selected by using a second design rule to prevent a physical layout violation from being created when moving the feature from the identified region;
      placing the grounding feature in the space; and
      automatically connecting the grounding feature to a gate feature in the mask layout file such that the antenna ratio is increased to greater than or approximately equal to the first design rule.

18. The integrated circuit of claim 17, wherein the antenna ratio comprises a ratio of a polysilicon over diffusion area to a polysilicon over field area.

19. The integrated circuit of claim 17, wherein the antenna ratio comprises a ratio of a polysilicon over diffusion area to a metal over field area.

20. The integrated circuit of claim 17, wherein moving the feature comprises maintaining connectivity associated with the moved feature.

21. The integrated circuit of claim 17, further comprising the interconnect and contact layers formed by compacting the pattern in the mask layout file in order to move the feature.

22. The integrated circuit of claim 17, further comprising the interconnect and contact layers formed by:
   placing the grounding feature outside of the identified region; and
   creating an electrical connection from the grounding feature to the gate feature in order to maintain connectivity.

* * * * *